Sept. 15, 1959

H. P. KELLY ET AL 2,904,643

BROADBAND BALANCED AMPLIFIER

Filed April 12, 1956

INVENTORS H. P. KELLY
R. L. NICHOLS
BY Patrick J. Roche
ATTORNEY 2,904,643

BROADBAND BALANCED AMPLIFIER

Hugh P. Kelly, Watchung, and Robert L. Nichols, South Plainfield, N.J., assignors to Bell Telephone Laboratories, Incorporated, New York, N.Y., a corporation of New York Application April 12, 1956, Serial No. 577,858

8 Claims. (Cl. 179—171)

Figure 1:
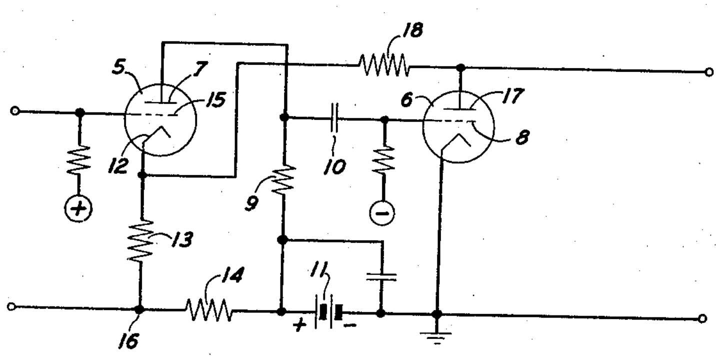

This invention relates to amplifiers, and more specifically to plural stage feedback amplifying circuits.

It is well known in the electronic amplifier art that if a portion of an amplifier output voltage is fed back to the input circuit around one or more amplification stages, 180 degrees out of phase with the input voltage, the effects of discharge device aging, changes in supply voltage, and noise generated within the stages around which feedback takes place can be reduced. This tends to make the amplifier characteristics more stable and thereby render the amplifier output a more faithful reproduction of the input. As is also well known in the amplifier art, the frequency response, that is the amplification versus frequency characteristic, of a feedback amplifier can be controlled by an appropriate arrangement of the impedance elements in the feedback path. Thus, if the feedback path were made up of resistance with no reactive impedance elements, the amplifier feedback factor would tend to be independent of frequency, resulting in an improved amplifier frequency response.

In plural stage amplifiers, however, it has heretofore been necessary when feeding a portion of the output voltage of one stage back to the input circuit of a preceding stage to provide in such feedback circuit a direct-current blocking capacitor. The purpose of this capacitor is to prevent the input circuit of such preceding stage from acting as a low-impedance load on output stage anode potential supply thereby shunting a substantial portion of the output stage anode supply energy away from the output discharge device. However, this capacitor also has an undesirable effect in broadband amplifiers because it tends to increase the low-frequency response of the overall amplifier above a desired flat response. This is so because such capacitor presents a higher impedance to signals of low frequencies than to signals of high frequencies thus reducing the effect of the negative feedback path in the low-frequency range.

It is therefore one object of the invention to improve the frequency response of plural stage feedback amplifiers.

Another object of the invention is to simplify the distribution of direct-current operating voltage in a multistage amplifier.

It is a further object to utilize certain circuit portions of a multistage amplifier for transmitting both signaling and operating voltages.

It is still another object to reduce the number of apparatus components required for the operation of a plural stage feedback amplifier.

It is a further object to facilitate the distribution of direct-current operating voltage in a plural stage amplifier having stages of different current carrying capabilities.

In an exemplary embodiment of the invention two cascade-connected electron discharge devices are provided with a direct-current feedback connection from the anode of the second device to the cathode of the first device. The anode potential for the first device is applied from a source of potential in the usual manner, but the anode potential for the second device is supplied from the same source over two parallel paths each of which includes the direct-current feedback connection. One of the parallel paths includes the first discharge device and the other includes a part of the input circuit to the first device.

Figure 2:
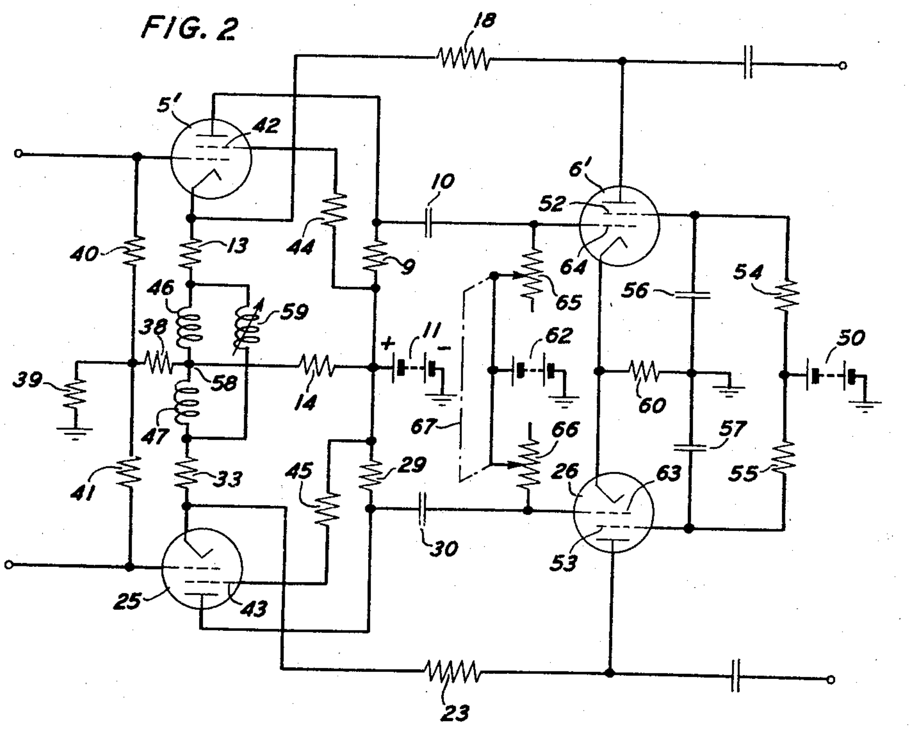

The above and other objects, together with certain advantages of the invention, will be appreciated more fully from a consideration of the following description when read in connection with the attached drawing in which:

Fig. 1 is a schematic diagram of a two-stage feedback amplifier in accordance with a specific embodiment of the invention; and Fig. 2 is a schematic diagram of a two-stage balanced feedback amplifier in accordance with a modified embodiment of the invention.

A two-stage feedback amplifier illustrated in Fig. 1 comprises a first amplifier electron discharge device 5 and a second amplifier electron discharge device 6, each including a control grid, a cathode and an anode. Anode 7 of device 5 is connected to control grid 8 of device 6 by a conventional R–C coupling circuit comprising a load impedance 9 and a coupling capacitor 10. A direct-current voltage source 11 provides operating potentials for devices 5 and 6 in a manner which will be subsequently described. The positive terminal of source 11 is connected to anode 7 of device 5 via load impedance 9 and to cathode 12 of device 5 via an impedance network including a resistor 13, which has a terminal connected to cathode 12, and a resistor 14 connected between the other terminal of resistor 13 and the positive terminal of source 11. Signals to be amplified are applied to the input circuit of device 5 comprising control grid 15, cathode 12 and resistor 13 connected between the latter cathode and junction point 16 of resistors 13 and 14. The output of the amplifier is taken from anode 17 of device 6 and ground.

In accordance with the embodiment of the invention shown in Fig. 1, a direct-current negative feedback path including a resistor 18 is connected between anode 17 of device 6 and cathode 12 of device 5. Operating potential for device 5 is provided by the potential across the resistors 13 and 14 which are part of a potential divider connection across the source 11 including in addition the feedback resistor 18 and the space-current path of device 6. Operating potential for device 6 is provided by the source 11 over two parallel paths which include some common portions. A first series path comprises the positive terminal of source 11, load impedance 9, the anode-cathode space-current path of device 5, feedback resistor 18, the anode-cathode space-current path of device 6, and the negative terminal of source 11. A second series path includes the positive terminal of source 11, the impedance network comprising resistors 13 and 14, feedback resistor 18, the anode-cathode space-current path of device 6, and the negative terminal of source 11.

Thus, both the first and second operating voltage supply paths for device 6 include the feedback connection in series; in addition, the portion of the first series path including load impedance 9 and the space-current circuit of device 5 is effectively connected in parallel with the portion of the second series path comprising voltage-divider resistors 13 and 14. Accordingly, the first and second series paths include the same portions for transmitting both signaling and operating voltages such, for example, as the feedback connection including resistor 18; the space-current circuits of both devices 5 and 6 are effectively connected in series although devices 5 and 6 are connected in tandem for signal amplification purposes; the respective first and second series voltage supply paths are effectively connected across the positive and negative terminals of source 11; and a single direct-current source supplies operating voltage to the anodes of both devices 5 and 6. When device 5 provides insufficient current-carrying capability for the demands of device 6, then such demands for the latter device are supplied from source 11 through a circuit comprising resistors 13 and 14, the feedback connection including resistor 18, and the space-current circuit of device 6.

When signals are supplied to the control grid 15 of the amplifier illustrated in Fig. 1, the flow of current through device 5 is regulated in accordance with signal amplitude variations, and the amplified signals appear as a correspondingly varying potential across load impedance 9 in the well-known manner. The amplified signals are further amplified in the usual manner by device 6. A portion of the output voltage of device 6, which is in phase with the signals applied to grid 15, is coupled back to the input circuit of device 5 through resistor 18. This has the effect of negative feedback because resultant current changes in resistor 13 introduce potential changes in the input circuit of device 5 which tend to oppose the effect of the input signals on the grid-cathode potential of device 5.

The invention of Fig. 1 may also be applied to a two-stage balanced, or push-pull, amplifier using tetrode discharge devices in the manner of a modified embodiment as illustrated in Fig. 2. The same reference numerals used in both Figs. 1 and 2 identify corresponding elements. In the input or first stage, an amplifier electron discharge device 25 complements electron discharge device 5′ in a balanced input circuit. Resistors 14, 38 and 39 constitute a voltage divider connected across the source 11 of direct-current voltage whereby grid bias for devices 5′ and 25 is provided via grid leak resistors 40 and 41, respectively. Because the total resistance of resistors 38 and 39 has a much larger value than the resistance of resistor 14, the bias so provided is essentially independent of space-current variations in devices 6′ and 26 which are also arranged in a balanced circuit to constitute the second stage. Screen grids 42 and 43 of devices 5′ and 25, respectively, are energized from source 11 through resistors 44 and 45, respectively. In this case resistors 44 and 45 are used to suppress high frequency parasitic resonances in the screen circuit and therefore no bypass condensers are provided from screen grids 42 and 43 to ground.

The output of first-stage devices 5′ and 25 is coupled to the input of output or second stage amplifier devices 6′ and 26 via resistance-capacitance interstage networks comprising load impedance 9 and capacitor 10, and load impedance 29 and capacitor 30, respectively. Feedback connections comprising a direct-current type and including resistors 18 and 23 are established between the anodes of output-stage devices 6′ and 26 and the cathodes of first-stage devices 5′ and 25, respectively. A source 50 of direct-current voltage energizes screen grids 52 and 53 of output-stage devices 6′ and 26, respectively, through resistors 54 and 55. Voltage source 50 shown here as a separate circuit element for convenience and simplicity will be understood to comprise the voltage source 11. Capacitors 56 and 57 provide alternating current bypass. Devices 6′ and 26 have their cathodes connected via a common resistor 60 to ground. This resistor provides local negative feedback for signals on the respective grids which are in phase but has substantially no effect on signals out of phase. While the devices 5′ and 6′ and 25 and 26 are shown as tetrode tubes, it will be apparent that such devices contemplate all structures having at least an anode, a cathode, and a control grid. Thus, the foregoing circuitry according to Fig. 2 is adaptable in the usual manner to receive balanced or unbalanced input signals and to furnish balanced output signals.

In accordance with the modification of the invention as shown in Fig. 2 inductances 46 and 47 are connected in series between cathode resistors 13 and 33, respectively, and a common point 58 which is connected in series with the voltage divider 14, 38 and 39. Inductances 46 and 47 provide a high impedance to alternating current thereby preventing a passage of such current through source 11. Variable inductance 59 connected in parallel with inductances 46 and 47 has a low inductance compared to that of either inductance 46 or 47, and as a consequence provides alternating current coupling between devices 5′ and 25. Variable inductance 59 also serves to adjust the high frequency response of the overall two-stage amplifier. Source 62 of direct-current voltage has its positive terminal connected to control grids 64 and 63 through grid leak resistors 65 and 66, respectively, which have their movable terminals connected together mechanically through link 67 for simultaneous manual actuation to adjust the low-frequency response of the overall amplifier. Voltage source 62 illustrated here as a separate element for simplicity and convenience could alternatively be derived from voltage source 11.

Operating potential from source 11 may be supplied to the anodes of devices 6′ and 26 via the feedback connections including resistors 18 and 23 in a manner which will now be explained. Referring to Fig. 2 operating potential from source 11 is supplied to the anodes of both devices 5′ and 6′ via a first series path including the positive terminal of source 11, load impedance 9, space-current path of device 5′, feedback connection including resistor 18, space-current circuit of device 6′, common cathode resistor 60 and ground. Also similar operating potential from source 11 is supplied to the anode of device 6′ via a second series path comprising the positive terminal of source 11, resistor 14, common point 58, inductance 46, cathode resistor 13, feedback connection including resistor 18, space-current circuit of device 6′, common cathode resistor 60 and ground. Thus, the first and second operating voltage supply paths include the feedback connection in series. In addition, the portion of the first series path including load impedance 9 and the space-current circuit of device 5′ is in parallel with the portion of the second series path comprising resistor 14, inductance 46 and cathode resistor 13. Accordingly, the first and second series paths include portions for transmitting both signaling and operating voltages; the space-current circuit of device 5′ is effectively connected in series with the space-current circuit of device 6′ while devices 5′ and 6′ are connected in tandem for signal amplification purposes; the respective first and second series paths are effectively connected between the positive and negative terminals of source 11; and the same source 11 supplies operating potential to the anodes of both devices 5′ and 6′.

Similarly, operating potential from source 11 may also be supplied to the anodes of both devices 25 and 26 via a first series path including the positive terminal of source 11, load impedance 29, space-current circuit of device 25, feedback connection including resistor 23, space-current circuit of device 26, common cathode resistor 60 and ground. Operating potential is also supplied to the anode of device 26 via a second series path comprising the positive terminal of source 11, resistor 14, common point 58, inductance 47, cathode resistor 33, feedback connection including resistor 23, space-current circuit of device 26, common cathode resistor 60 and ground. Thus, the first and second operating voltage supply paths include the feedback connection in series. In addition, the portion of the first series path including load impedance 29 and the space-current circuit of device 25 is in parallel with the portion of the second series path comprising resistor 14, the inductance 47, and cathode resistor 33. Thus, the first and second operating voltage supply paths for the anodes of devices 25 and 26 are essentially identical with the corresponding operating voltage supply paths for the above-described anodes of devices 5′ and 6′, from the standpoints of circuitry and operation.

Although the present invention has been disclosed herein with reference to certain embodiments, it will be understood that various modifications of these embodiments will occur to those skilled in the art without departing from the spirit and scope of the invention.

What is claimed is:

1. In a multistage signal amplifier comprising at least two amplifier vacuum tubes each having an input circuit and an output circuit connected thereto, one tube including at least a cathode and the other at least an anode, means for connecting the output circuit of said one tube to the input circuit of said other tube, a metallic feedback circuit for coupling signal amplitude variations at said anode to said cathode, said feedback circuit comprising an impedance connected in series between said anode and said cathode, a source of direct-current potential, and means comprising two paths for supplying operating potential to said anode from said source, one of said paths including said one tube and said feedback circuit, and the other of said paths including a portion of said input circuit of said one tube and said feedback circuit.

2. A broad band amplifier comprising two amplifier electron devices connected in tandem, one device including at least a cathode and the other at least a cathode and anode, an input circuit connected to said one device, an output circuit connected to said other device, a feedback resistor connecting said anode of said other device to said cathode of said one device, a source of operating potential, first circuit means including said one device and feedback resistor in series for supplying operating potential from said sources to said anode, and second circuit means including in series a part of said input circuit, said feedback resistor, and a portion of said first circuit means exclusive of said one device for also supplying operating potential from said source to said cathode and anode of said other device.

3. A broadband signal amplifier comprising a first electron amplifier device and a second electron amplifier device, said first device including at least a cathode, said second device including at least a cathode and an anode, a signal input circuit connected to said first device and including said cathode thereof, a first resistor connected to said cathode in said input circuit, a signal output circuit connected to said second device and including said anode and cathode thereof, a direct-current feedback connection for coupling signals from said anode to said cathode of said first device, said feedback connection comprising a second resistor, means including a load impedance for said first device for coupling signals in the output of said first device to the input of said second device, a source of operating potential, means for connecting the space-current paths of said first and second devices in series between the terminals of said source for supplying operating potential to said devices, said connecting means comprising said load impedance, the space-current path of said first device, said second resistor, and the space-current path of said second device, and additional means for supplying operating potential from said source to said cathode and anode of said second device, said additional means including said first resistor and said feedback connection.

4. In a push-pull signal amplifier having an input stage and an output stage connected in tandem, each stage including two electron amplifier devices, each input device including at least a cathode and an anode, each output device including at least an anode and a control grid, direct-current feedback connections for coupling signals from the anodes of said output devices to the cathodes of corresponding input devices, a source of operating potential, impedance means for connecting the cathodes of said input devices to a first terminal of said source, other impedance means for connecting said first terminal to the anodes of said input devices, means for supplying operating potentials from said first terminal to the anodes of said input devices and of said output devices, said last-mentioned means including the space-current path of each input device in series with the space-current path of the corresponding output device and also including said other impedance means, said feedback connections, and connections from each of said output devices to a second terminal of said source, and additional means for supplying operating potential from said source to said anodes of said output devices, said additional means including said first-mentioned impedance means, said feedback connections, and said connections to said second terminal.

5. The amplifier according to claim 4 in which said first-mentioned impedance means comprises two substantially identical impedances, corresponding ends of said last-mentioned impedances are connected to the cathodes of said respective input devices, other corresponding ends of said last-mentioned impedances are connected to a common point, and a resistance is connected between said common point and said first terminal of said source.

6. The amplifier according to claim 4 in which said first-mentioned impedance means includes a pair of inductances, each having one end connected to the cathode of one of said input devices and an opposite end to said first terminal of said source, a variable inductance is connected between the cathodes of said input devices in parallel with said first-mentioned impedance means for adjusting the high-frequency response of said amplifier, the effective inductance of said variable inductance is much less than the effective inductance of either inductance of said inductance pair, capacitive coupling means are connected between each input device anode and a corresponding output device control grid, a pair of variable resistors is provided for adjusting the low-frequency response of said amplifier, a fixed terminal of each of said variable resistors is connected to said control grid of one of said output devices, and corresponding movable terminals of said variable resistors are connected to said first terminal of said source.

7. A multistage signal amplifier comprising two tandem-connected amplifier vacuum tubes with different current handling capacities, one of said vacuum tubes having at least an anode and a control grid and the other of said vacuum tubes having at least an anode, a control grid, and a cathode, a single source of anode potential for said tubes, said source having first and second terminals, means for connecting the space-current paths of said vacuum tubes in series with one another between said first and second terminals of said source for supplying operating potentials to said tubes, a first impedance, means for connecting said first impedance between said first terminal of said source and said connecting means in parallel with a portion of said connecting means including said one vacuum tube for supplying operating potential to said other tube, a second impedance connected in series in said connecting means between the cathode of said first tube and the anode of said second tube, a signal input circuit connected between said one tube grid and an intermediate point on said first impedance, means for coupling signals from said one tube anode to said other tube grid, and a signal output circuit connected between said other tube anode and cathode.

8. In a multistage signal amplifier comprising two amplifier vacuum tubes, each including a control grid, a cathode and anode, an input circuit connected to the control grid and cathode of one tube, an output circuit connected to the anode and cathode of the other tube, a load impedance for said one tube, means for coupling signals from the anode of said one tube to the control grid of said other tube, a feedback resistor for coupling signals from the anode of said other tube to the cathode of said one tube, a source of direct-current potential, means including said load impedance for connecting one terminal of said source to the anode of said one tube, and means comprising two different paths but both paths including said feedback resistor for supplying operating potential from said one terminal of said source to the anode of said other tube; one of said paths also including said load impedance and said one tube and the other of said paths also including a portion of said input circuit which is connected to said cathode of said one tube.

References Cited in the file of this patent

UNITED STATES PATENTS

| | | |
|---|---|---|
| 2,069,809 | Armstrong | Feb. 9, 1937 |

| | | |
|---|---|---|
| 2,358,428 | White | Sept. 19, 1944 |
| 2,428,295 | Scantlebury | Sept. 30, 1947 |
| 2,638,512 | Bessey | May 12, 1953 |
| 2,679,029 | Jose | May 18, 1954 |
| 2,689,886 | Cooper et al. | Sept. 21, 1954 |
| 2,802,070 | Fishbine et al. | Aug. 6, 1957 |